(12) United States Patent
Shiga et al.

(10) Patent No.: US 7,879,635 B2
(45) Date of Patent: Feb. 1, 2011

(54) METHOD FOR MANUFACTURING SEMICONDUCTOR OPTICAL DEVICE

(75) Inventors: Toshihiko Shiga, Tokyo (JP); Hitoshi Sakuma, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 802 days.

(21) Appl. No.: 11/772,297

(22) Filed: Jul. 2, 2007

(65) Prior Publication Data

US 2008/0020502 A1 Jan. 24, 2008

(30) Foreign Application Priority Data

Jul. 21, 2006 (JP) ............................. 2006-199574
May 24, 2007 (JP) ............................. 2007-137581

(51) Int. Cl.
H01L 21/00 (2006.01)
(52) U.S. Cl. .......................................................... 438/31
(58) Field of Classification Search .................. 438/22, 438/31
See application file for complete search history.

(56) References Cited

U.S. PATENT DOCUMENTS

| 4,943,970 | A | * | 7/1990 | Bradley | ................... | 372/45.01 |
| 5,008,893 | A | * | 4/1991 | Amann et al. | ............... | 372/50.1 |
| 5,293,392 | A | * | 3/1994 | Shieh et al. | ............... | 372/45.01 |
| 5,333,141 | A | * | 7/1994 | Wolf et al. | ..................... | 372/20 |
| 5,474,954 | A | * | 12/1995 | Yang | .......................... | 438/39 |
| 5,504,768 | A | * | 4/1996 | Park et al. | ...................... | 438/39 |
| 6,122,414 | A | * | 9/2000 | Shimizu | .......................... | 385/2 |
| 6,144,682 | A | * | 11/2000 | Sun | ............................ | 372/45.01 |
| 6,171,876 | B1 | * | 1/2001 | Yuang et al. | ................... | 438/22 |
| 6,174,747 | B1 | * | 1/2001 | Ho et al. | ........................ | 438/31 |
| 6,222,866 | B1 | * | 4/2001 | Seko | ........................ | 372/50.12 |
| 6,278,720 | B1 | * | 8/2001 | Lee et al. | ................... | 372/46.01 |
| 6,335,215 | B1 | * | 1/2002 | Yuang | .......................... | 438/31 |
| 6,335,216 | B1 | * | 1/2002 | Yoshida et al. | ................. | 438/40 |
| 6,365,429 | B1 | * | 4/2002 | Kneissl et al. | ................. | 438/46 |
| 6,744,800 | B1 | * | 6/2004 | Kneissl et al. | ............. | 372/50.1 |
| 6,778,751 | B2 | * | 8/2004 | Tada et al. | ................... | 385/131 |
| 6,852,558 | B2 | * | 2/2005 | Lee et al. | ....................... | 438/32 |

(Continued)

FOREIGN PATENT DOCUMENTS

JP 2000-022261 1/2000

(Continued)

*Primary Examiner*—N. Drew Richards
*Assistant Examiner*—Jae Lee
(74) *Attorney, Agent, or Firm*—Leydig, Voit & Mayer, Ltd.

(57) ABSTRACT

A method for manufacturing a laser diode includes: providing a semiconductor structure in which semiconductor layers are laminated; forming a waveguide ridge in the layers; forming an $SiO_2$ film over the entire surface; forming a second resist pattern covering the $SiO_2$ film in channels adjacent the waveguide ridge such that top surfaces of the second resist pattern in the channels are higher than the top surface of a p-GaN layer in the waveguide ridge and lower than the top surface of the $SiO_2$ film on the top of the waveguide ridge, the second resist pattern exposing the top surface of the $SiO_2$ film on the top of the waveguide ridge; removing the $SiO_2$ film, using the second resist pattern as a mask, to expose the top surface of the p-GaN layer in the waveguide ridge; and forming an electrode layer on the top surface of the p-GaN layer.

11 Claims, 5 Drawing Sheets

U.S. PATENT DOCUMENTS

| | | | | |
|---|---|---|---|---|
| 6,940,885 | B1 * | 9/2005 | Cheng et al. | 372/50.1 |
| 6,995,406 | B2 * | 2/2006 | Tojo et al. | 257/103 |
| 7,020,173 | B2 * | 3/2006 | Yamamoto et al. | 372/45.01 |
| 7,075,962 | B2 * | 7/2006 | Ryou et al. | 372/46.011 |
| 7,126,977 | B2 * | 10/2006 | Kaneko | 372/99 |
| 7,141,441 | B2 * | 11/2006 | Koyama et al. | 438/22 |
| 7,177,336 | B2 | 2/2007 | Taneya et al. | |
| 7,280,712 | B2 * | 10/2007 | Liu | 385/3 |
| 7,406,111 | B2 * | 7/2008 | Sung et al. | 372/45.01 |
| 7,433,381 | B2 * | 10/2008 | Wang et al. | 372/50.124 |
| 7,525,123 | B2 * | 4/2009 | Kotani | 257/81 |
| 2002/0096494 | A1 * | 7/2002 | Lu et al. | 216/57 |
| 2006/0043409 | A1 * | 3/2006 | Ohmi | 257/103 |
| 2006/0078020 | A1 | 4/2006 | Izu et al. | |
| 2006/0172444 | A1 * | 8/2006 | Jungnickel et al. | 438/14 |

FOREIGN PATENT DOCUMENTS

| | | |
|---|---|---|
| JP | 2000-340880 | 12/2000 |
| JP | 2003-142769 | 5/2003 |
| JP | 2005-347630 A | 12/2005 |
| JP | 2006-93379 A | 4/2006 |
| WO | WO 03/085790 | 10/2003 |

* cited by examiner

METHOD FOR MANUFACTURING SEMICONDUCTOR OPTICAL DEVICE

BACKGROUND OF THE INVENTION

1. Field of the Invention

The present invention relates to a method for manufacturing a semiconductor optical device, and more particularly to a method for manufacturing a semiconductor optical device in which the waveguide ridge has an electrode on its top.

2. Description of the Related Art

There has been a need for emission of light in the blue to ultraviolet wavelength range to enhance the recording density of optical discs. In order to meet such a need, intense R&D effort has recently been carried out to develop nitride semiconductor lasers formed of a Group III-V nitride compound semiconductor such as AlGaInN. Some of them have already been practically used.

Such blue-violet laser diodes (hereinafter referred to as "blue-violet LDs") are formed by growing a compound semiconductor in crystal form on a GaN substrate.

A representative compound semiconductor is the Group III-V compound semiconductor, in which Group III and V elements are combined together. Mixed crystal III-V compound semiconductors having different compositions can be formed by bonding pluralities of Group III atoms and Group V atoms in different manners. Examples of compound semiconductors used to form a blue-violet LD include GaN, GaPN, GaNAs, InGaN, and AlGaN.

In ridge waveguide LDs, an electrode layer is usually provided on top of the waveguide ridge. This electrode layer is connected to the contact layer (i.e., the top layer of the waveguide ridge) through an opening formed in the insulating film covering the top portion of the waveguide ridge. This insulating film with the above opening is formed by lift-off using the same resist mask that was used to form the waveguide ridge. However, since the surface of the resist mask in contact with the contact layer is concavely curved with respect to the surface of the contact layer, part of the material used to form the insulating film covering the waveguide ridge remains in this concave portion and hence partly covers the surface of the contact layer even after the lift-off process, resulting in a reduction in the contact area between the electrode layer and the contact layer. The contact area is smaller than the top surface area of the contact layer.

In the case of a red LD, the material used to form the contact layer (e.g., GaAs, etc.) has a relatively low contact resistance. Therefore, the above reduction in the contact area between the electrode layer and the contact layer due to the lift-off process does not significantly increase the contact resistance, and hence the operating voltage of the LD.

In a blue-violet LD, on the other hand, the material used to form the contact layer is GaN, etc. having a relatively high contact resistance. Therefore, a reduction in the contact area between the electrode and the contract layer results in an increase in the contact resistance between them, thereby increasing the operating voltage of the blue-violet LD.

There will now be described several known methods for manufacturing an LD in such way as to prevent a reduction in the contact area between the electrode and the contact layer.

A first method forms a nitride semiconductor laser device in the following manner. First, a p-type electrode layer of palladium/molybdenum/gold is formed on a p-type contact layer which is the top layer of the semiconductor layer stack formed on a wafer. A resist mask (not shown) having a stripe shape is then formed on the p-type electrode layer and used to form a ridge stripe by RIE (Reactive Ion Etching). More specifically, the p-type electrode is formed by etching using Ar gas, and then the p-type contact layer and the p-type cladding layer, or these layers and the p-type guiding layer, are etched by a mixed gas composed of Ar, $Cl_2$, and $SiCl_4$ to form the ridge stripe. The etching is stopped at a depth halfway through the p-type cladding layer or the p-type guiding layer. Next, an insulating film (of Zr oxide predominantly including $ZrO_2$) having a thickness of 0.5 μm is formed over the surface of the wafer with the ridge strip still leaving the resist thereon. The resist is then removed to expose the top surface of the ridge stripe. Further, a p-type pad electrode of molybdenum and gold is formed to cover the p-type electrode and at least the portions of the insulating film on both sides of the p-type electrode. (See, e.g., Japanese Domestic Republication of International Patent Application No. WO 2003/085790, lines 42-50 on page 9, and FIG. 1.)

A second known method is a self-aligning method for manufacturing a ridge waveguide semiconductor LD and includes the step of forming two different photoresist layers one on top of the other, as described below.

The lower photoresist layer is sensitive only to light of wavelengths shorter than 300 nm, while the upper photoresist layer is sensitive only to light of wavelengths longer than 300 nm. Specifically, this self-aligning method is applied to a laminated semiconductor structure that includes a second cladding waveguide layer and a capping layer formed on the second cladding waveguide layer. The method begins by removing portions of the capping layer and the second cladding waveguide layer to form a ridge structure and a double channel. A second insulating film is then formed on the surfaces of the ridge structure and the double channel. A first photoresist layer, the lower photoresist layer, is then formed on the second insulating film, and a second photoresist layer, the upper photoresist layer, is formed on the first photoresist layer. Next, the second photoresist layer is patterned to expose the portions of the first photoresist layer around the ridge structure. Further, the first photoresist layer is processed by an RIE process to expose the portion of the second insulating film on the ridge structure. The portions of the second insulating film around the ridge structure are then removed by an etching process including an RIE process. The remaining portions of the first and second photoresist layers are then removed, and a first metal layer is deposited as an electrode. (See, e.g., JP-A-2000-22261, paragraphs 0024 to 0034, and FIGS. 7 to 18.)

A third known method first forms a ridge and channels by wet etching the contact layer by using a metal mask (of Al) and then wet etching the underlying layer by using as a mask this contact layer with the metal mask still thereon. Next, an insulating film is formed over the entire surface of the substrate by plasma CVD, and the Al pattern (the metal mask) and the portions of the insulating film on the Al pattern are removed by lift-off. A resist pattern is then formed by a common lithographic process. This resist pattern exposes the portion of the surface where a p-type electrode is subsequently formed. A layer of electrode material is then formed by vacuum deposition using the resist pattern as a mask, and subsequently the resist pattern and the portion of the electrode material layer on the resist pattern are removed by lift-off to form the electrode in close contact with the contact layer of the ridge. See, e.g., JP-A-2000-340880, paragraphs 0025 to 0034, and FIG. 1.

A fourth known method proceeds as follows. A first protective film is formed over substantially the entire surface of a contact layer, and a third protective film having a stripe shape is formed on the first protective film. Then, after etching the first protective film with the third protective film thereon, the third protective film is removed. This step processes the first protective film into a stripe shape. The p-side contact layer is then etched through its entire thickness and the underlying layer (for example, a p-side cladding layer) is etched halfway through its thickness to form a waveguide having a stripe shape. Next, a second protective film, which has electrically insulating properties and is made of a different material than the first protective film, is formed on the sides of the stripe-shaped waveguide and on the top surface of the nitride semiconductor layer (i.e., the p-side cladding layer) exposed by the above etching process. The first protective film is then removed by lift-off, and a p-electrode is formed on the second protective film and the p-side contact layer such that the p-electrode is electrically connected to the p-side contact layer. (See, e.g., JP-A-2003-142769, paragraphs 0020 to 0027, and FIG. 1.)

The above conventional methods provide a sufficient contact area between the contact layer of the waveguide ridge and the electrode layer. However, these methods are disadvantageous in that it is difficult to reliably manufacture devices having substantially equal characteristics, since they include the step of: etching a metal film and the underlying semiconductor layer at the same time; etching the lower of two laminated resist layers to a predetermined controlled depth; or forming an electrode by lift-off after forming a metal film mask or a plurality of protective films. Further, employing a plurality of resists or protective films results in reduced freedom in process design.

SUMMARY OF THE INVENTION

The present invention has been made to solve the above problems. It is, therefore, a primary object of the present invention to provide a method for manufacturing a semiconductor optical device with a high yield and in such a way as to reliably prevent a reduction in the contact area between the top semiconductor layer of the waveguide ridge and the overlying electrode layer by employing a simple process.

According to one aspect of the present invention, there is provided a method for manufacturing a semiconductor optical device according to the present invention comprising: forming a laminated semiconductor structure made up of a first semiconductor layer of a first conductive type, an active layer, and a second semiconductor layer of a second conductive type in sequence on a semiconductor substrate; forming by a photolithography process a first resist pattern of the resist film disposed on a top surface of the laminated semiconductor structure, the first resist pattern having a stripe-shaped portion having a width corresponding to a waveguide ridge; removing portions of the upper surface side of the second semiconductor layer by dry etching using the first resist pattern as a mask to form concave portions leaving a part of the second semiconductor layer on the bottom, and to form the waveguide ridge; forming a first insulating film on a top surface of the laminated semiconductor structure including the concave portions after removing the first resist pattern; forming a second resist pattern covering the first insulating film in the concave portions adjacent the waveguide ridge and exposing the top surface of the first insulating film on the top of the waveguide ridge, the second resist pattern having a top surface on the concave portions being higher than a top surface of the second semiconductor layer in the waveguide ridge and lower than a top surface of the first insulating film on a top of the waveguide ridge; removing the first insulating film by etching using the second resist pattern as a mask to expose the top surface of the second semiconductor layer in the waveguide ridge; and forming an electrode layer on the exposed top surface of the second semiconductor layer in the waveguide ridge. Thus, the second resist pattern is formed in the concave portions adjacent the waveguide ridge such that the top surfaces of the second resist pattern in the concave portions are higher than the top surface of the second semiconductor layer in the waveguide ridge and lower than the top surface of the first insulating film on the top of the waveguide ridge. This arrangement allows material of the first insulating film to be removed by etching using the second resist pattern such that the second semiconductor layer on the top of the waveguide ridge is exposed but the first insulating film is left on the sides of the waveguide ridge and on the bottoms of the concave portions.

Accordingly, in the method for manufacturing a semiconductor optical device according to the present invention, the second resist pattern is formed in the concave portions adjacent the waveguide ridge such that the top surfaces of the second resist pattern in the concave portions are higher than the top surface of the second semiconductor layer in the waveguide ridge and lower than the top surface of the first insulating film on the top of the waveguide ridge. This arrangement allows material of the first insulating film to be removed by etching using the second resist pattern such that the second semiconductor layer on the top of the waveguide ridge is exposed but the first insulating film is left on the sides of the waveguide ridge and on the bottoms of the concave portions. Thus, the above simple process allows the electrode layer to be formed in contact with the second semiconductor layer while avoiding a reduction in the contact area between them. This means that it is possible to manufacture a semiconductor optical device with a high yield by employing a simple process.

According to another aspect of the present invention, there is provided a method for manufacturing a semiconductor optical device according to the present invention comprising: forming by a photolithography process a first resist pattern of the resist film disposed on a top surface of a laminated semiconductor structure made up of a first semiconductor layer of a first conductive type, an active layer, and a second semiconductor layer of a second conductive type in sequence on a substrate, the first resist pattern having a portion shaped in correspondence to a waveguide ridge; removing portions of the upper surface side of the second semiconductor layer by etching using the first resist pattern as a mask to form concave portions leaving a part of the second semiconductor layer on the bottom, and to form the waveguide ridge; forming a first insulating film on a top surface of the laminated semiconductor structure including the concave portions after removing the first resist pattern; forming a second resist pattern covering the first insulating film in the concave portions adjacent the waveguide ridge and exposing the top surface of the first insulating film on the top of the waveguide ridge, the second resist pattern having a top surface on the concave portions being higher than a top surface of the second semiconductor layer in the waveguide ridge and lower than a top surface of the first insulating film on a top of the waveguide ridge; removing the first insulating film by etching using the second resist pattern as a mask to expose the top surface of the second semiconductor layer in the waveguide ridge; and forming an electrode layer on the exposed top surface of the second semiconductor layer in the waveguide ridge.

Accordingly, in the method for manufacturing a semiconductor optical device according to the present invention, the second resist pattern is formed in the concave portions adjacent the waveguide ridge such that the top surfaces of the second resist pattern in the concave portions are higher than the top surface of the second semiconductor layer in the waveguide ridge and lower than the top surface of the first insulating film on the top of the waveguide ridge. This arrangement allows material of the first insulating film to be removed by etching using the second resist pattern such that the second semiconductor layer on the top of the waveguide ridge is exposed but the first insulating film is left on the sides of the waveguide ridge and on the bottoms of the concave portions. Thus, the above simple process allows the electrode layer to be formed in contact with the second semiconductor layer while avoiding a reduction in the contact area between them. This means that it is possible to manufacture a semiconductor optical device with a high yield by employing a simple process.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

While preferred embodiments of the present invention will be described with reference to blue-violet LDs (a type of semiconductor optical device), it is to be understood that the invention is not limited to blue-violet LDs. The present invention can be applied to any semiconductor optical device such as a red LD, with the same effect. Therefore, examples of materials that can be used to form the laminated semiconductor structure include, in addition to nitride semiconductors, InP-based materials and GaAs-based materials. Further, examples of substrates include, in addition to GaN substrates, other semiconductor substrates such as InP, GaAs, Si, and SiC substrates and insulating substrates such as sapphire substrates.

First Embodiment

Figure 1:
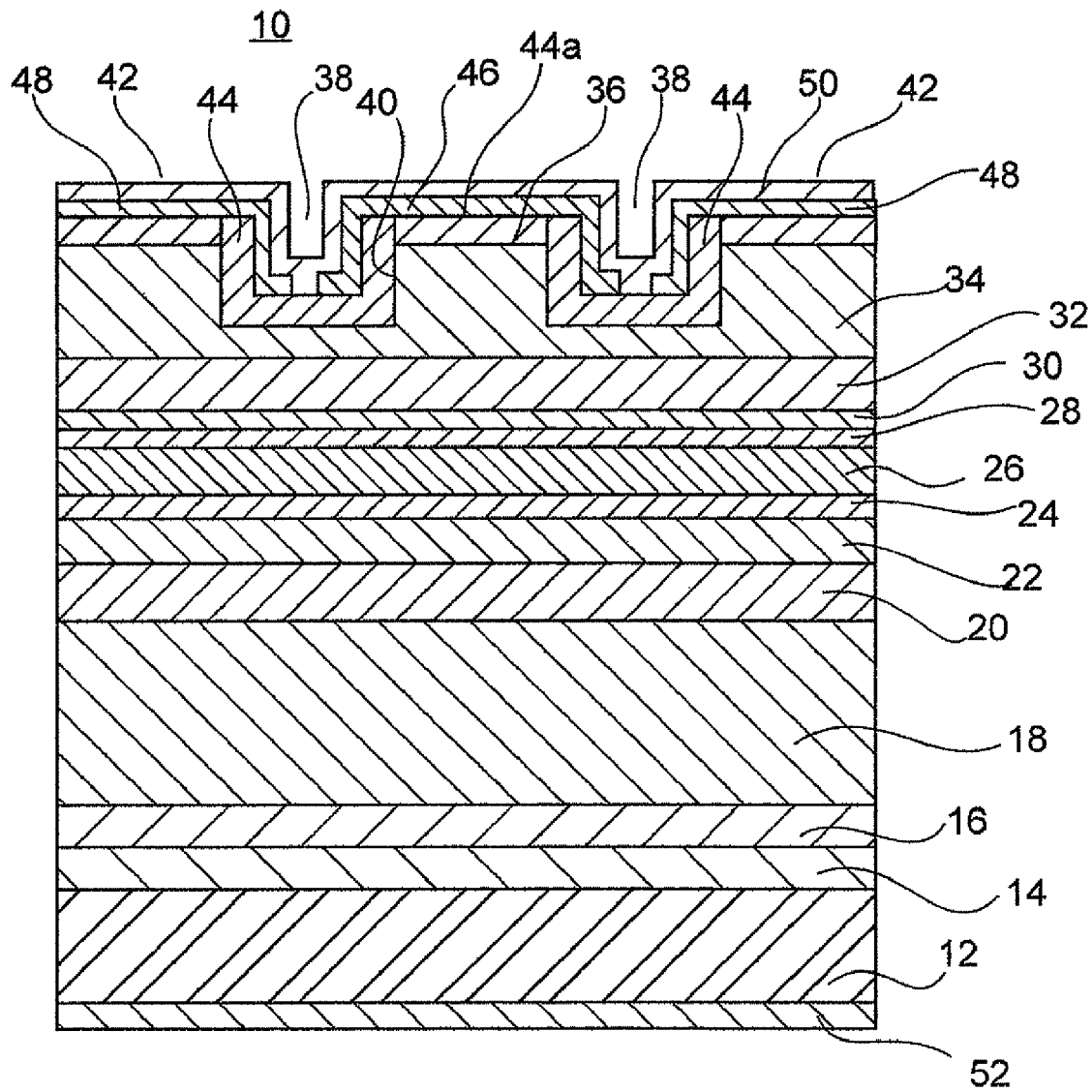
FIG. 1 is a cross-sectional view of a semiconductor LD 10 according to one embodiment of the present invention.

FIG. 1 is a cross-sectional view of a semiconductor LD 10 according to one embodiment of the present invention. It should be noted that in the figures, like numerals are used to denote like or corresponding components.

Referring to FIG. 1, the LD 10 is a ridge waveguide blue-violet LD in which the following layers are sequentially formed on top of one another on one principal surface (a Ga surface) of an n-type GaN substrate 12 (n-type, p-type, and i-type (undoped) being hereinafter abbreviated as "n-," "p-," and "i-," respectively): a buffer layer 14 of n-GaN; a first n-cladding layer 16 of n-AlGaN formed on the buffer layer 14; a second n-cladding layer 18 of n-AlGaN formed on the first n-cladding layer 16; a third n-cladding layer 20 of n-AlGaN formed on the second n-cladding layer 18; an n-light guiding layer 22 of n-GaN formed on the third n-cladding layer 20; an n-side SCH (Separate Confinement Heterostructure) layer 24 of InGaN; and an active layer 26 on the n-side SCH layer 24. It should be noted that the first to third n-cladding layers 16, 18, 20 constitute a first semiconductor layer.

Further, the following layers are sequentially formed on top of one another on the active layer 26: a p-side SCH layer 28 of InGaN; an electron barrier layer 30 of p-AlGaN; a p-side light guiding layer 32 of p-GaN; a p-cladding layer 34 of p-AlGaN; and a contact layer 36 of p-GaN. According to the present embodiment, the p-cladding layer 34 and the contact layer 36 constitute a second semiconductor layer. In other embodiments, however, only one layer, or three or more layers, may constitute the second semiconductor layer.

Channels 38 serving as concave portions are formed in the contact layer 36 and the p-cladding layer 34. As a result, the contact layer 36 and the portion of the p-cladding layer 34 in contact with the contact layer 36 form a waveguide ridge 40.

The waveguide ridge 40 is located in a center portion of the width of the cleaved surfaces (or resonator end faces) of the LD 10 and extends between the resonator end faces. The longitudinal dimension of the waveguide ridge 40, that is, the resonator length, is 1000 µm, and the ridge width perpendicular to the longitudinal direction is one micron to a few tens of microns. The present embodiment assumes this width to be 1.5 µm.

Further according to the present embodiment, the width of the channels is 10 µm. The raised platform portions on both sides of the waveguide ridge 40 with the channels 38 therebetween are referred to herein as the "electrode pad platforms 42."

The height of the waveguide ridge 40, that is, its height from the bottom surface of the channels 38, is, for example, 0.5 µm.

A first silicon insulating film 44, serving as a first insulating film, covers the sides of the channels 38 (i.e., the sidewalls of the waveguide ridge 40 and the sidewalls of the electrode pad platforms 42) and the bottom surfaces of the channels 38. The first silicon insulating film 44 is made up of, for example, an $SiO_2$ film having a thickness of 200 nm. The first silicon insulating film 44 does not cover the top surface of the contact layer 36; the opening 44a formed in the first silicon insulating film 44 exposes the entire top surface of the contact layer 36.

A p-side electrode 46 is disposed on and electrically coupled to the top surface of the contact layer 36. The p-side electrode 46 is formed by sequentially depositing platinum (Pt) and Au by vacuum deposition. It covers the top surface of the contact layer 36 and also covers the first silicon insulating film 44 on the sidewalls of the waveguide ridge 40 and on portions of the bottom surfaces of the channels 38.

Further, a second silicon insulating film 48 formed, for example, of $SiO_2$ covers the top surfaces of the electrode pad platforms 42 and also covers the first silicon oxide film 44 on the sides of the electrode pad platforms 42 (within channels 38) and on portions of the bottom surfaces of the channels 38.

A pad electrode 50 is disposed on and in close contact with the top surface of the p-side electrode 46. It covers the p-side electrode 46, the first silicon insulating film 44, and the second silicon insulating film 48 within both channels 38 and also covers the second silicon insulating film 48 on the top surfaces of the electrode pad platforms 42.

Further, an n-side electrode 52 is disposed on the bottom surface of the n-GaN substrate 12. The n-side electrode 52 is formed by sequentially depositing Ti and Au films by vacuum deposition.

This LD 10 is doped with silicon (Si) and magnesium (Mg), which act as n-type and p-type impurities, respectively.

The n-GaN substrate 12 has a thickness of approximately 500-700 nm, and the buffer layer 14 has a thickness of approximately 1 µm. The first n-cladding layer 16 has a thickness of approximately 400 nm and is formed, for example, of n-$Al_{0.07}Ga_{0.93}N$. The second n-cladding layer 18 has a thickness of approximately 1000 nm and is formed, for example, of n-$Al_{0.045}Ga_{0.955}N$. The third n-cladding layer 20 has a thickness of approximately 300 nm and is formed, for example, of n-$Al_{0.015}Ga_{0.985}N$.

The n-side light guiding layer 22 has a thickness of, for example, 80 nm. The n-side SCH layer 24 has a thickness of 30 nm and is formed of i-$In_{0.02}Ga_{0.98}N$.

The active layer 26 has a double quantum well structure made up of a well layer 26a of i-$In_{0.12}Ga_{0.88}N$ having a thickness of 5 nm, a barrier layer 26b of i-$In_{0.02}Ga_{0.98}N$ having a thickness of 8 nm, and a well layer 26c of i-$In_{0.12}Ga_{0.88}N$ having a thickness of 5 nm. The well layer 26a is disposed on and in contact with the n-side SCH layer 24, the barrier layer 26b is disposed on the well layer 26a, and the well layer 26c is disposed on the barrier layer 26b.

The p-side SCH layer 28 disposed on and in contact with the well layer 26c of the active layer 26 has a thickness of 30 nm and is formed of i-$In_{0.02}Ga_{0.98}N$.

The electron barrier layer 30 has a thickness of approximately 20 nm and is formed of p-$Al_{0.2}Ga_{0.8}N$. The p-side light guiding layer 32 has a thickness of 100 nm, and the p-cladding layer 34 has a thickness of approximately 500 nm and is formed of p-$Al_{0.07}Ga_{0.93}N$. The contact layer 36 has a thickness of 20 nm.

There will now be described a method for manufacturing the LD 10.

FIGS. 2 to 13 are partial cross-sectional views illustrating process steps in a method for manufacturing a semiconductor LD according to the present invention.

It should be noted that FIGS. 2 to 13 do not show the electron barrier layer 30 and the underlying layers including the n-GaN substrate 12, since these layers do not change in any way in the process steps described below. These figures only show a cross section of a portion of the p-side light guiding layer 32 and a cross section of each overlying layer.

The manufacturing method begins by providing a GaN substrate 12 whose surfaces have been cleaned by thermal cleaning. An n-GaN layer (which will become the buffer layer 14) is then formed on the GaN substrate 12 by metalorganic chemical vapor deposition (MOCVD) at a growth temperature of, e.g., 1000° C.

Next, the following layers are sequentially formed on top of one another: an n-$Al_{0.07}Ga_{0.93}N$ layer (which will become the first n-cladding layer 16); an n-$Al_{0.045}Ga_{0.955}N$ layer (the second n-cladding layer 18); an n-$Al_{0.015}Ga_{0.985}N$ layer (the third n-cladding layer 20); an i-$In_{0.02}Ga_{0.98}N$ layer (the n-side light guiding layer 22); and an i-$In_{0.02}Ga_{0.98}N$ layer (the n-side SCH layer 24). Further, an i-$In_{0.12}Ga_{0.88}N$ layer (which will become the well layer 26a), an i-$In_{0.02}Ga_{0.98}N$ layer (the barrier layer 26b), and an i-$In_{0.12}Ga_{0.88}N$ layer (the well layer 26c) are sequentially formed on top of one another on the n-side SCH layer 24. (The well layers 26a and 26c and the barrier layer 26b sandwiched therebetween form the active layer 26, as described above.)

Figure 2:
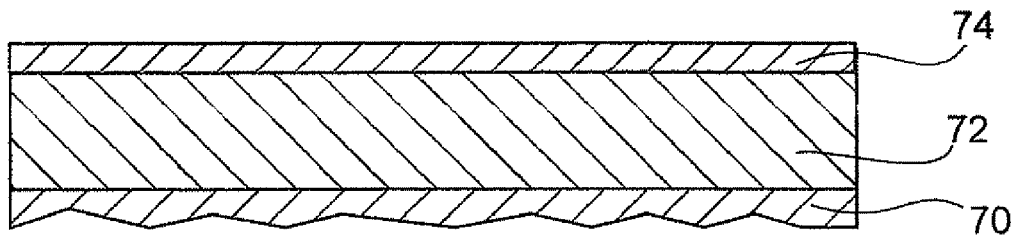
FIGS. 2 to 13 are partial cross-sectional views illustrating process steps in a method for manufacturing a semiconductor LD according to the present invention.

Next, the following layers are sequentially formed on top of one another on the active layer 26: an i-$In_{0.02}Ga_{0.98}N$ layer (which will become the p-side SCH layer 28); a p-$Al_{0.2}Ga_{0.8}N$ layer (the electron barrier layer 30); a p-$Al_{0.2}Ga_{0.8}N$ layer 70 (the p-side light guiding layer 32); a p-$Al_{0.07}Ga_{0.93}N$ layer 72 (the p-cladding layer 34); and a p-GaN layer 74 (the contact layer 36). As a result, the wafer has formed thereon a laminated semiconductor structure as shown in FIG. 2.

Figure 3:
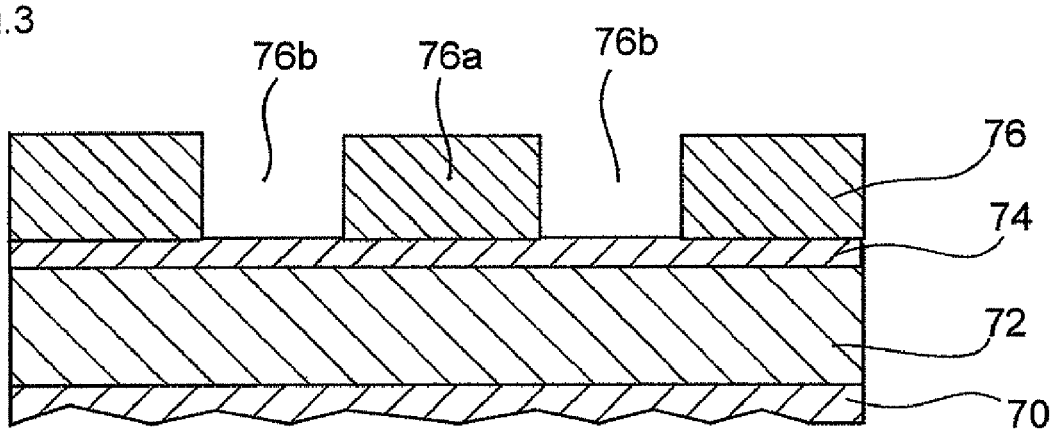

Referring now to FIG. 3, a resist is applied over the entire surface of the wafer on which the above layers have been grown in crystal form, and this resist is patterned into a resist pattern 76 serving as a first resist pattern by photolithography process. The resist pattern 76 includes a portion 76a remaining in correspondence to the shape of the waveguide ridge 40 (formed later in the process) and cutout portions 76b corresponding to the shapes of the channels 38, as shown in FIG. 3. According to the present embodiment, the portion 76a corresponding to the shape of the waveguide ridge 40 has a width of 1.5 µm, and the cutout portions 76b corresponding to the shape of the channels 38 have a width of 10 µm.

Figure 4:
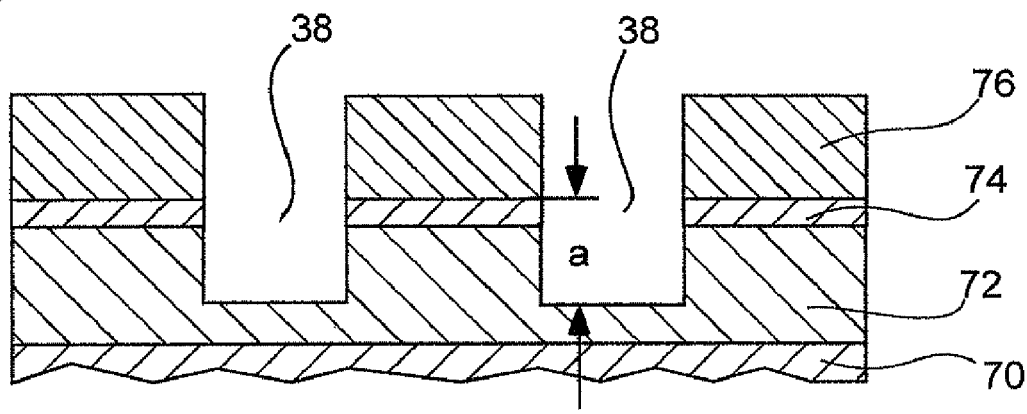

Referring now to FIG. 4, the p-GaN layer 74 is etched through its entire thickness and the p-$Al_{0.07}Ga_{0.93}N$ layer 72 is etched to a predetermined depth by RIE (Reactive Ion Etching) using the resist pattern 76 as a mask to form the channels 38 whose bottoms are defined by remaining portions of the p-$Al_{0.07}Ga_{0.93}N$ layer 72. According to the present embodiment, the entire etch depth a is 500 nm (0.5 µm). Forming the channels 38 results in the formation of the waveguide ridge 40 and the electrode pad platforms 42, as shown in FIG. 4.

Figure 5:
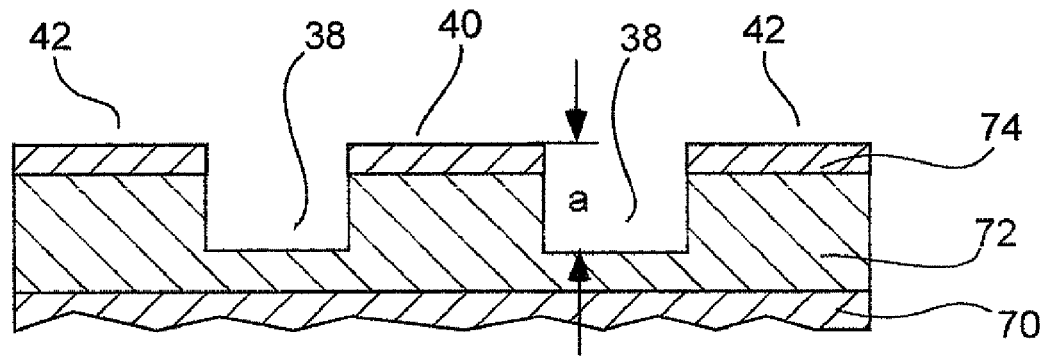

Referring now to FIG. 5, the resist pattern 76, which has been used for the above etching, is removed by an organic solvent, etc., with the result that the depth of the channels 38, that is, the height of the waveguide ridge 40, is equal to the etch depth a (500 nm, or 0.5 µm). It should be noted that this step also forms (or processes) the electrode pad platforms 42, as shown in FIG. 5.

Figure 6:
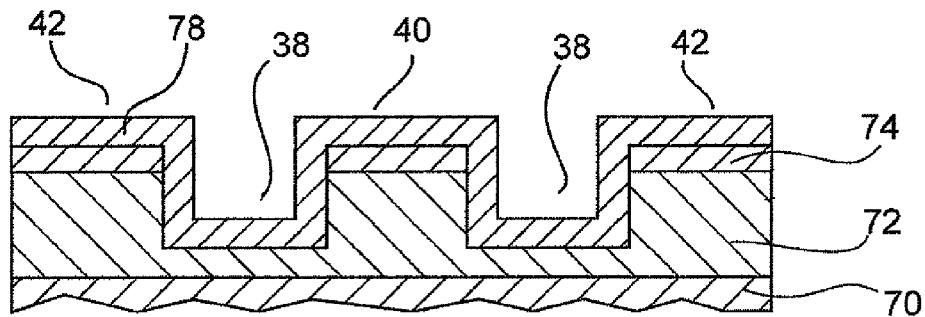

Referring now to FIG. 6, an $SiO_2$ film 78 which will become the first silicon insulating film 44 serving as a first insulating film is formed over the entire surface of the wafer by CVD, vacuum deposition, sputtering, etc. to a thickness of, e.g., 0.2 µm. The $SiO_2$ film 78 covers the top surface of the waveguide ridge 40, the inner surfaces of the channels 38, and the top surfaces of the electrode pad platforms 42, as shown in FIG. 6.

Figure 7:
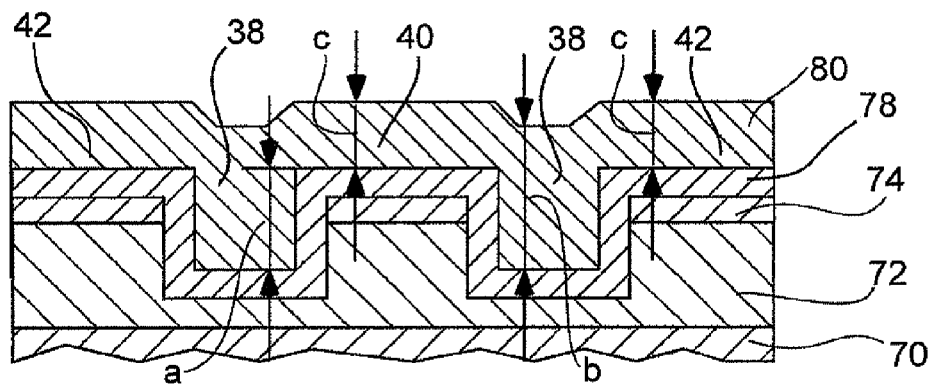

Referring now to FIG. 7, a photoresist is applied over the entire surface of the wafer to form a resist film 80 such that the thickness b of the resist film 80 on the channels 38 is greater than the thickness c of the resist film 80 on the top of the waveguide ridge 40 and on the tops of the electrode pad platforms 42. For example, the resist film 80 may be formed such that b=0.8 µm and c=0.4 µm.

Although, in FIG. 7, the top surface of the resist film 80 is lower on the channels 38 than on the top of the waveguide ridge 40 and on the tops of the electrode pad platforms 42 (that is, the surface is concavely curved on the channels 38), it may be uniformly flat across the entire top surface of the resist film 80, which automatically ensures that b>c.

However, according to the present embodiment, the top surface of the resist film 80 may have any shape if the inequality b>c is satisfied. That is, the top surface of the resist film 80 may be concavely curved on the channels 38, as in FIG. 7.

Generally, spin coating is used to apply a photoresist to a wafer. That is, the resist is dropped onto the wafer, which is then rotated to form a film having a uniform thickness.

The thickness of the resist film can be controlled by adjusting the amount of photoresist applied to the wafer and its viscosity, and the rotational speed of the wafer and the time during which the wafer is rotated.

When a resist film is formed on a nonuniform wafer surface by spin coating (as shown in FIG. 7), the resultant film thickness is not uniform and greater on the concave portions of the surface (i.e., in the above example, on the bottom surfaces of the channels 38) than on the convex portions (i.e., in the above example, on the top surfaces of the waveguide ridge 40 and the electrode pad platforms 42). However, the amount of change in the thickness of the resist film across the surface depends on the viscosity of the photoresist.

In the case of a wafer such as that shown in FIG. 7, when the $SiO_2$ film 78 has the same thickness on the bottoms of the channels 38 as on the top of the waveguide ridge 40 and on the tops of the electrode pad platforms 42, if the viscosity of the photoresist is low, the equation $b=c+a$ may hold, where: a is the etch depth of the channels 38, b is the thickness of the resist film 80 on the channels 38, and c is the thickness of the resist film 80 on the top of the waveguide ridge 40 and on the tops of the electrode pad platforms 42. That is, the top surface of the resist film 80 is uniformly flat.

On the other hand, if the viscosity of the photoresist is high, the resist film 80 may have substantially the same thickness on the channels 38 as on the top of the waveguide ridge 40 and on the tops of the electrode pad platforms 42 (i.e., $b=c$). (That is, the top surface of the resist film 80 is not uniformly flat and is concavely curved on the channels 38.

It should be noted that in the wafer shown in FIG. 7 the resist film 80 has a greater thickness on the channels 38 than on the top of the waveguide 40 and on the tops of the electrode pad platforms 42 (i.e., $b>c$) in most cases that the top surface of the resist film 80 is not uniformly flat and is concavely curved on the channels 38 unless the viscosity of the photoresist is extremely low.

Thus, by suitably adjusting the viscosity of the resist and the rotational speed of the wafer, it is possible to form the resist film 80 such that the inequality $b>c$ holds, where b is the thickness of the resist film 80 on the channels 38 and c is the thickness of the resist film 80 on the top of the waveguide ridge 40 and on the tops of the electrode pad platforms 42. FIG. 7 shows the results of this process step.

Figure 8:
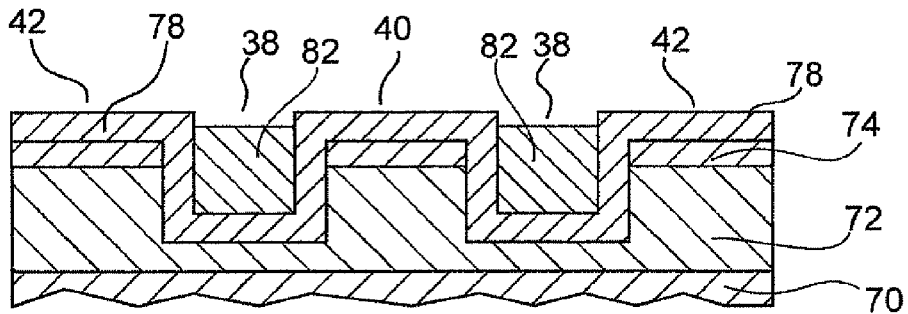

Referring now to FIG. 8, material is uniformly removed from the surface of the resist film 80 so that the resist film 80 is completely removed from on top of the waveguide ridge 40 and the electrode pad platforms 42 but left in the channels 38, thereby forming a resist pattern 82 that exposes the top of the waveguide ridge 40 and the tops of the electrode pad platforms 42.

For example, a predetermined thickness of material (e.g., in this embodiment, 400 nm of material) is removed from the surface of the resist film 80, for example, by $O_2$ plasma dry etching so that the $SiO_2$ film 78 on the top of the waveguide ridge 40 and on the tops of the electrode pad platforms 42 are completely exposed and the top surfaces of the resist film 80 on the channels 38 are higher than the top surface of the p-GaN layer 74.

Before the above etching step, the thickness of the resist film 80 on the channels 38 is approximately 800 nm and the thickness of the resist film 80 on the top of the waveguide ridge 40 and on the tops of the electrode pad platforms 42 is approximately 400 nm. Therefore, the above removal of 400 nm of material from the surface of the resist film 80 by etching completely removes the resist film 80 from on top of the waveguide ridge 40 and the electrode pad platforms 42 and thereby exposes the top surfaces of the $SiO_2$ film 78. Further, this also results in the fact that the top surfaces of the resist film 80 on the channels 38 are lower than the top surfaces of the $SiO_2$ film 78 on top of the waveguide ridge 40 by one-half of the thickness of the $SiO_2$ film 78. The remaining resist film 80 forms the resist pattern 82 serving as a second resist pattern.

The above uniform etching of the surface of the resist film 80 is accurately stopped at a desired depth, as described below.

For example, when the resist film is dry etched by using $O_2$ plasma, the amount of etching is controlled in the following manner.

In such etching, CO generated as a result of the reaction between oxygen in the $O_2$ plasma and carbon in the photoresist is excited within the plasma to emit (excited) light having a wavelength of 451 nm. Therefore, the dry etching may be performed while observing the intensity of this light.

More specifically, as the dry etching proceeds, the amount of resist material that has been removed from the top surface of the resist film 80 on the top of the waveguide ridge 40 and on the tops of the electrode pad platforms 42 increases. This eventually results in a reduction in the top surface area of the resist film 80 to be etched and hence a reduction in the intensity of the emitted 451 nm light.

The point at which to stop the etching process may be determined by observing this reduction in intensity, which allows accurate control of the etching stop timing.

Of course, the following factors actually vary across the wafer surface to some extent: the height of the waveguide ridge 40, the thickness of the resist film 80 on the top of the waveguide ridge 40 and on the tops of the electrode pad platforms 42, and the etching rate of the photoresist. Therefore, care must be taken to ensure that the resist film 80 is completely removed from on top of the waveguide ridge 40 and the electrode pad platforms 42. For example, the etching may be stopped a predetermined time after a reduction in the light intensity has been observed.

The following is another method for determining the point at which to stop the etching process.

During the dry etching process, single wavelength light (e.g., a laser beam) is emitted toward the top of the waveguide ridge 40 and the tops of the electrode pad platforms 42 from a location facing the wafer surface.

The intensity of the reflected light from the top of the waveguide ridge 40 and the tops of the electrode pad platforms 42 varies according to the remaining thickness of the resist film 80 on these tops. Therefore, the remaining thickness of the resist film 80 on the top of the waveguide ridge 40 and on the tops of the electrode pad platforms 42 can be determined by observing the intensity of this reflected light. A command to stop the etching process may be issued when the remaining thickness has been reduced to zero.

Both methods allow accurately detecting the amount of etching of the resist film 80 during the etching process. This makes it possible to etch the resist film 80 so that the film is completely removed from on top of the waveguide ridge 40 and the electrode pad platforms 42 but left in the channels 38, thereby forming the resist pattern 82, as shown in FIG. 8.

Figure 9:
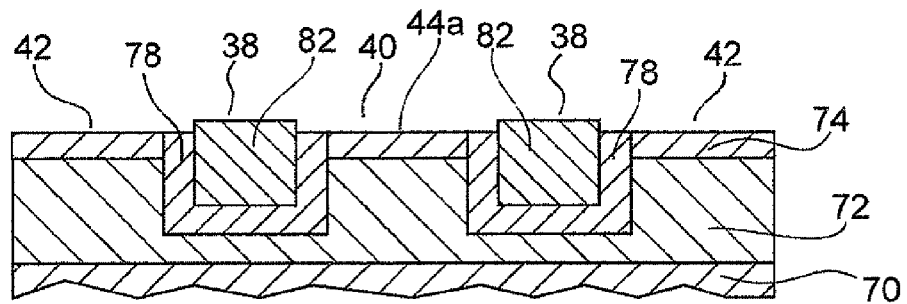

Referring now to FIG. 9, the exposed surface of the $SiO_2$ film 78 is uniformly etched by using the resist pattern 82 as a mask so that the film is completely removed from on top of the waveguide ridge 40 and the electrode pad platforms 42 but left on the sides and bottoms of the channels 38. As a result, the $SiO_2$ film 78 has an opening 44a on the top of the waveguide ridge 40.

This etching may be performed by dry etching such as reactive ion etching, or wet etching using buffered hydrofluoric acid, etc.

In such cases, too, the amount of etching can be accurately controlled, as described below.

For example, when the $SiO_2$ film 78 is dry etched by a fluorine-containing gas such as $CF_4$ gas, $SiF_2$ generated as a result of the reaction between Si in the $SiO_2$ film 78 and F in the etching gas emits light having a wavelength of approximately 390 nm. Therefore, the intensity of this light may be observed to determine whether the SiO$_2$ film 78 has been completely removed from on top of the waveguide ridge 40 and the electrode pad platforms 42. The etching process may be stopped if it is determined from the intensity that those portions of the SiO$_2$ film 78 have been completely removed.

On the other hand, when the SiO$_2$ film 78 is wet etched by buffered hydrofluoric acid, etc., a single wavelength laser beam may be emitted from a location facing the wafer surface toward the SiO$_2$ film 78 on the top of the waveguide ridge 40 and on the tops of the electrode pad platforms 42. The intensity of the reflected light may be then observed to determine the remaining thickness of the SiO$_2$ film 78 on the top of the waveguide ridge 40 and on the tops of the electrode pad platforms 42. The etching may be stopped when the remaining thickness has been reduced to zero. FIG. 9 shows the results of this process step.

Figure 10:
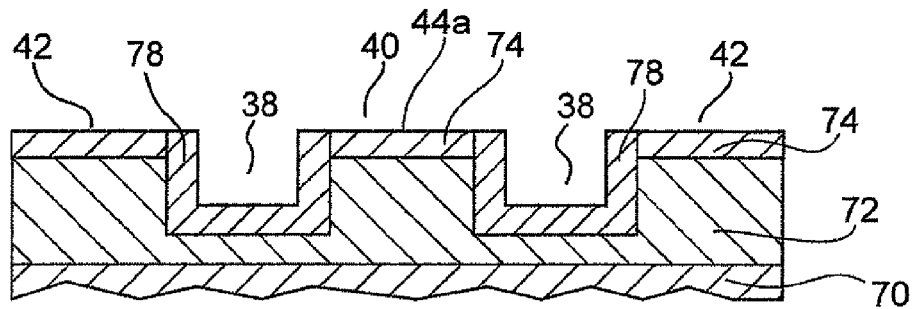

Referring now to FIG. 10, the resist pattern 82 is removed by wet etching using an organic solvent.

Figure 11:
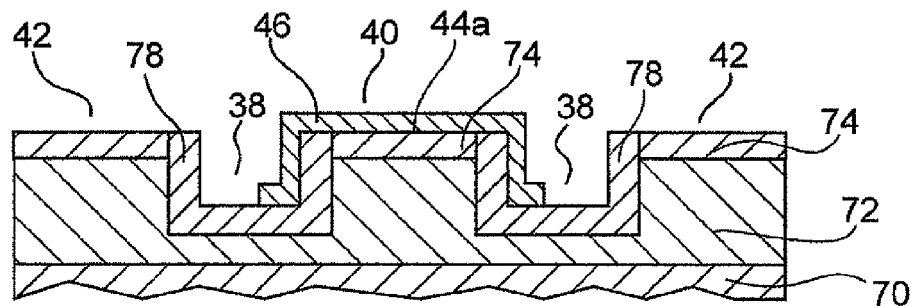

Referring now to FIG. 11, a p-side electrode 46 is formed on the top of the waveguide ridge 40.

More specifically, first, a resist is applied over the entire surface of the wafer and patterned by a photolithography process into a resist pattern (not shown) that exposes the top surface of the p-GaN layer 74 (i.e., the top layer of the waveguide ridge 40), the sidewalls of the waveguide ridge 40, and portions of the bottoms of the channels 38. An electrode layer made up of a laminated structure of Pt and Au is then formed over the resist pattern by, for example, vacuum deposition, and the resist film (or pattern) and the portions of the electrode layer on the resist film are removed by lift-off to form the p-side electrode 46.

Thus, the top surface of the p-GaN layer 74 on the waveguide ridge 40 is not covered with the SiO$_2$ film 78 and is entirely exposed through the opening 44a (when the electrode layer is formed), preventing a reduction in the contact area and hence an increase in the contact resistance between the p-side electrode 46 and the p-GaN layer 74. FIG. 11 shows the results of this process step.

Figure 12:
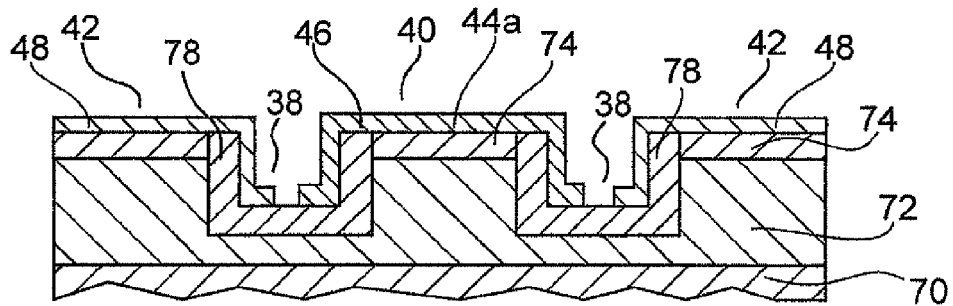

Referring now to FIG. 12, a second silicon insulating film 48 is then formed.

More specifically, first, a resist is applied over the entire surface of the wafer and patterned by a photolithography process into a resist pattern (not shown) that exposes the surface of the wafer except for the surface of the p-side electrode 46 (that is, exposes the top surfaces of the electrode pad platforms 42, the sides of the electrode pad platforms 42 within the channels 38, and portions of the bottoms of the channels 38). An SiO$_2$ film is then formed over the entire surface of the wafer by vapor deposition to a thickness of 100 nm, and the resist film (pattern) on the p-side electrode 46 and the portion of the SiO$_2$ film on the resist film are removed by lift-off to form a second silicon insulating film 48 (made up of the remaining portions of the SiO$_2$ film). FIG. 12 shows the results of this process step.

Figure 13:
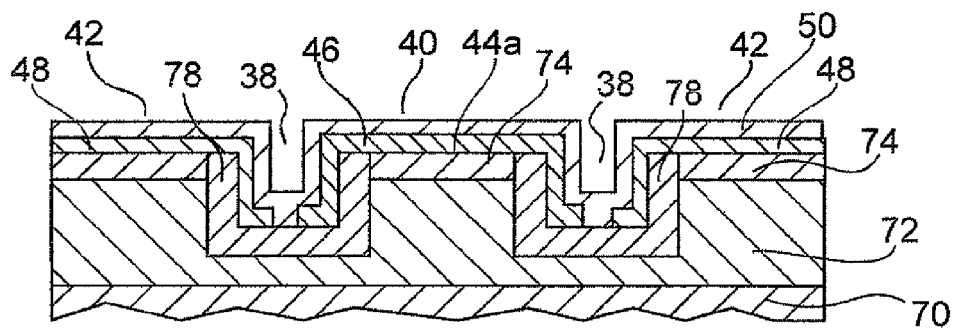

Lastly, referring now to FIG. 13, a metal film of Ti, Pt, and Au is formed over the p-side electrode 46, the channels 38, and the second silicon insulating film 48 to form a pad electrode 50 by vacuum deposition.

Variation 1

Figure 14:
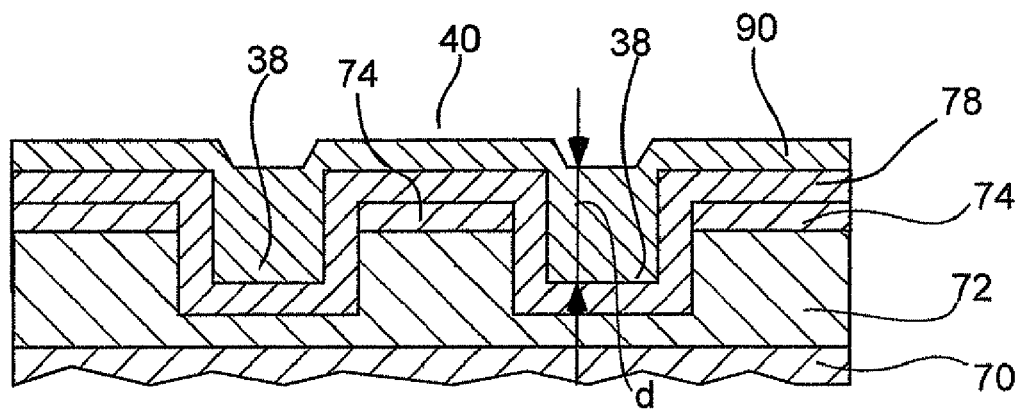
FIGS. 14 to 16 are partial cross-sectional views illustrating process steps in another method for manufacturing a semiconductor LD according to the present invention.
Figure 15:
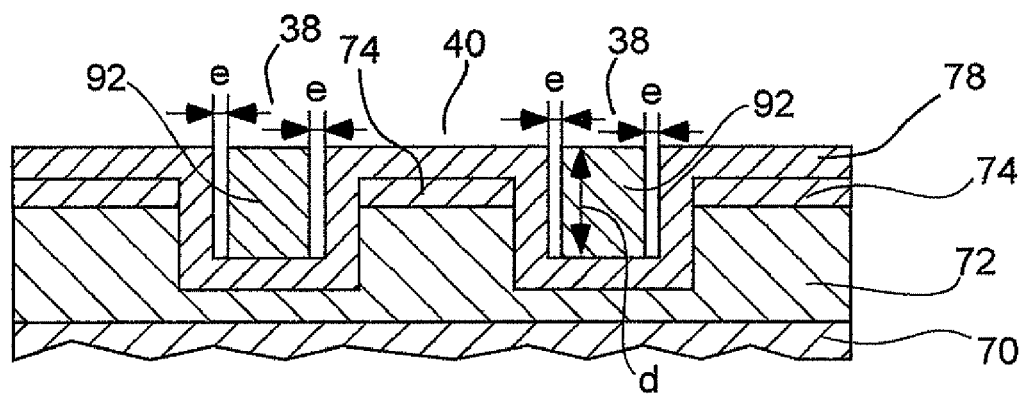
Figure 16:
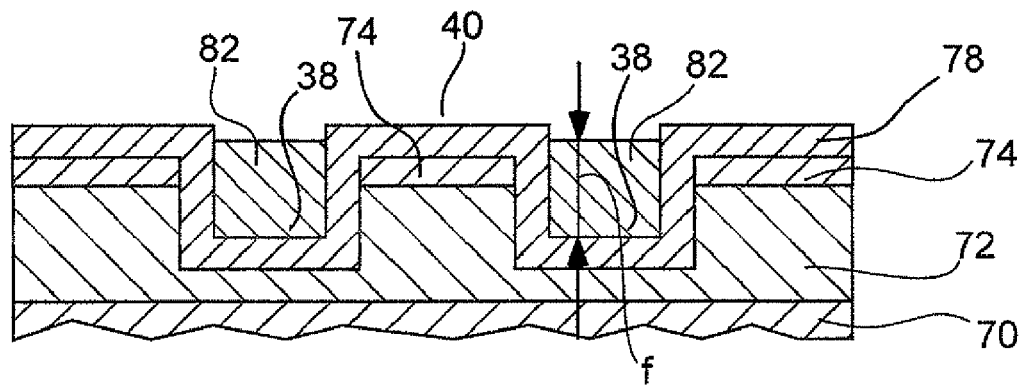

FIGS. 14 to 16 are partial cross-sectional views illustrating process steps in another method for manufacturing a semiconductor LD according to the present invention.

The steps of this manufacturing method shown in FIGS. 1 to 6 are the same as those in this variation. However, this manufacturing method includes the steps shown in FIGS. 14 to 16 instead of those shown in FIGS. 7 and 8.

After the SiO$_2$ film 78 is formed over the top surface of the waveguide ridge 40, the inner surfaces of the channels 38, and the top surfaces of the electrode pad platforms 42 at the step shown in FIG. 6, referring now to FIG. 14, a resist predominantly composed of a novolac resin is applied over the entire surface of the wafer to form a resist film 90 such that the top surfaces of the resist film 90 on the channels 38 adjacent the waveguide ridge 40 are substantially level with the top surface of the SiO$_2$ film 78 on the top of the waveguide ridge 40.

According to the present embodiment, the thickness d of the resist film 90 on the channels 38, that is, the height from the top surfaces of the SiO$_2$ film 78 on the bottoms of the channels 38 to the top surface of the resist film 90, is 500 nm (0.5 μm).

In this case, the thickness d of the resist film 90 on the channels 38 can be accurately controlled to a desired value by suitably adjusting the viscosity of the resist and the rotational speed of the wafer, as in the case of forming the resist film 80 described with reference to FIG. 7. FIG. 14 shows the results of this process step.

Referring now to FIG. 15, the resist film 90 is then removed by a photolithography process except on portions of the SiO$_2$ film 78 on the bottoms of the channels 38 to entirely expose the top surfaces of the SiO$_2$ film 78 on the top of the waveguide ridge 40 and on the tops of the electrode pad platforms 42, thereby forming a resist pattern 92. The remaining portions of the resist film 90, which form the resist pattern 92, are spaced a predetermined distance e from the SiO$_2$ film 78 on the sidewalls of the waveguide ridge 40 and on the sidewalls of the electrode pad platforms 42 within the channels 38, and exposes the top surfaces of the SiO$_2$ film 78 on the top of the waveguide ridge 40 and on the tops of the electrode pad platforms 42, as shown in FIG. 15.

Referring now to FIG. 16, the wafer is then heat treated, for example, at 140° C. in the atmosphere for 10 minutes to soften or plasticize the photoresist (or the resist pattern 92). As a result, material of the resist pattern 92 flows to fill the above gaps e between the resist pattern 92 and the SiO$_2$ film 78 on the sidewalls of the waveguide ridge 40 and on the sidewalls of the electrode pad platforms 42 (that is, flows and comes into close contact with the SiO$_2$ film 78 on these sidewalls). FIG. 16 shows the resultant resist pattern 82, which is in close contact with the SiO$_2$ film 78 on the above sidewalls within the channels 38 and exposes the top of the waveguide ridge 40 and the tops of the electrode pad platforms 42.

The top surfaces of the resist pattern 82 within the channels 38 must be lower than the top surfaces of the SiO$_2$ film 78 on the top of the waveguide ridge 40 and on the tops of the electrode pad platforms 42 and higher than the top surfaces of the p-GaN layer 74 on the top of the waveguide ridge 40 and on the tops of the electrode pad platforms 42. According to the present embodiment, the height f of the resist pattern 82 is 400 nm.

To achieve this, the gaps e are formed to have a size that allows the resist pattern 82 to have a desired height f (which may be calculated by assuming that the volume of the resist pattern does not change between the process steps shown in FIGS. 15 and 16 and hence the cross-sectional area of the resist pattern 82 is equal to that of the resist pattern 92).

It should be noted that although in FIG. 15 gaps e are provided on both sides of the resist pattern 92 within the channels 38, they may be provided only on one side of the resist pattern 92 if this allows the resist pattern 82 to have the desired height f. FIG. 16 shows the results of this process step.

The subsequent steps are the same as those shown in FIGS. 9 to 13 described above.

The above method of the present embodiment for manufacturing the LD 10 proceeds as follows. Channels 38 are formed in a wafer having a semiconductor layer stack formed thereon, thereby forming a waveguide ridge 40 and electrode pad platforms 42. An $SiO_2$ film 78 is then formed over the entire surface of the wafer.

A resist is then applied over the entire surface of the wafer to form a resist film 80 having a greater thickness on the channels 38 than on the top of the waveguide ridge 40 and on the tops of the electrode pad platforms 42.

Next, material is uniformly removed from the surface of the resist film 80 so that the film is completely removed from on top of the waveguide ridge 40 and the electrode pad platforms 42 but left in the channels 38, thereby forming a resist pattern 82 that exposes the top of the waveguide ridge 40 and the tops of the electrode pad platforms 42.

The exposed surface of the $SiO_2$ film 78 is then uniformly etched by using the resist pattern 82 as a mask so that the $SiO_2$ film is completely removed from on top of the waveguide ridge 40 and the electrode pad platforms 42 but left on the sides and bottoms of the channels 38. As a result, the $SiO_2$ film 78 has an opening 44a on the top of the waveguide ridge 40.

Then, after removing the resist pattern 82, a p-side electrode 46 is formed on the top of the waveguide ridge 40.

In these LD manufacturing methods, when the p-side electrode 46 is formed on and in contact with the top surface of a semiconductor layer (that is, the p-GN layer 74, which will become the contact layer 36), the top surface of is the p-GN layer not covered with the $SiO_2$ film 78 and is entirely exposed through the opening 44a, thereby avoiding a reduction in the contact area and hence avoiding an increase in the contact resistance between the p-side electrode 46 and the contact layer 36 to prevent an increase in the operating voltage.

The resist film 80 can be formed to have a greater thickness on the channels 38 than on the top of the waveguide ridge 40 and on the tops of the electrode pad platforms 42 by adjusting the viscosity of the photoresist and the rotational speed of the wafer.

Further, the above uniform etching of the surface of the resist film 80 can be accurately stopped at a desired depth, as described below. It should be noted that in this etching process, material is uniformly removed from the surface of the resist film 80 so that the film is completely removed from on top of the waveguide 40 and the electrode pad platforms 42 but left in the channels 38, thereby forming the resist pattern 82 that exposes the top of the waveguide ridge 40 and the tops of the electrode pad platforms 42. For example, in the case where the resist film is dry etched by using $O_2$ plasma, the point at which to stop the etching process may be determined by observing the light emitted from CO in the plasma. Further, when the resist film is dry etched or wet etched, a single wavelength laser beam may be emitted from a location facing the wafer surface toward the top of the waveguide ridge 40 and the tops of the electrode pad platforms 42. With this arrangement, the point at which to stop the etching process may be determined by observing the intensity of the reflected light, resulting in accurate control of the etching stop timing.

Similar techniques may be used to reliably remove the $SiO_2$ film 78 from on top of the waveguide ridge 40 and the electrode pad platforms 42 and thereby reliably form the opening 44a. Thus, the present embodiment allows one to manufacture the LD 10 with a high yield by employing a simple process.

The following is another method for forming the resist pattern 82 by processing the resist film 90 so that the film is removed from on top of the waveguide ridge 40 and the electrode pad platforms 42 (exposing the tops of the waveguide ridge 40 and the electrode pad platforms 42) but left in the channels 38.

First of all, the channels 38 are formed in a wafer having a semiconductor layer stack formed thereon, thereby forming the waveguide ridge 40 and the electrode pad platforms 42. An $SiO_2$ film 78 is then formed over the entire surface of the wafer. Next, a resist predominantly composed of a novolac resin is applied over the entire surface of the wafer to form a resist film 90 such that the top surfaces of the resist film 90 on the channels 38 are substantially level with the top surface of the $SiO_2$ film 78 on the top of the waveguide ridge 40. The resist film 90 is then removed by a photolithography process except on the $SiO_2$ film 78 on portions of the bottoms of the channels 38 to entirely expose the top surfaces of the $SiO_2$ film 78 on the top of the waveguide ridge 40 and on the tops of the electrode pad platforms 42, thereby forming a resist pattern 92. The remaining portions of the resist film 90, which form the resist pattern 92, are spaced a predetermined distance e from the $SiO_2$ film 78 on the sidewalls of the waveguide ridge 40 and on the sidewalls of the electrode pad platforms 42 within the channels 38, as shown in FIG. 15. The wafer is then heat treated to cause material of the resist pattern 92 (or the resist film 90) to flow and come in close contact with the $SiO_2$ film 78 on the inner walls of the channels 38 (that is, the sidewalls of the waveguide ridge 40 and the electrode pad platforms 42), thereby forming the resist pattern 82, as shown in FIG. 16.

In this manufacturing method, too, the $SiO_2$ film 78 can be reliably removed from on top of the waveguide ridge 40 and the electrode pad platforms 42 to form the opening 44a, allowing one to manufacture the LD 10 with a high yield by employing a simple process.

Thus, a method for manufacturing a semiconductor optical device according to the present invention comprises: forming a laminated semiconductor structure made up of a first semiconductor layer of a first conductive type, an active layer, and a second semiconductor layer of a second conductive type in sequence on a semiconductor substrate; forming by a photolithography process a first resist pattern of the resist film disposed on a top surface of the laminated semiconductor structure, the first resist pattern having a stripe-shaped portion having a width corresponding to a waveguide ridge; removing portions of the upper surface side of the second semiconductor layer by dry etching using the first resist pattern as a mask to form concave portions leaving a part of the second semiconductor layer on the bottom, and to form the waveguide ridge; forming a first insulating film on a top surface of the laminated semiconductor structure including the concave portions after removing the first resist pattern; forming a second resist pattern covering the first insulating film in the concave portions adjacent the waveguide ridge and exposing the top surface of the first insulating film on the top of the waveguide ridge, the second resist pattern having a top surface on the concave portions being higher than a top surface of the second semiconductor layer in the waveguide ridge and lower than a top surface of the first insulating film on a top of the waveguide ridge; removing the first insulating film by etching using the second resist pattern as a mask to expose the top surface of the second semiconductor layer in the waveguide ridge; and forming an electrode layer on the exposed top surface of the second semiconductor layer in the waveguide ridge. Thus, the second resist pattern is formed in the concave portions adjacent the waveguide ridge such that the top surfaces of the second resist pattern in the concave portions are higher than the top surface of the second semiconductor layer in the waveguide ridge and lower than the top surface of the first insulating film on the top of the waveguide ridge. This arrangement allows material of the first insulating film to be removed by etching using the second resist pattern such that the second semiconductor layer on the top of the waveguide ridge is exposed but the first insulating film is left on the sides of the waveguide ridge and on the bottoms of the concave portions. Thus, the above simple process allows the electrode layer to be formed in contact with the second semiconductor layer while avoiding a reduction in the contact area between them. This means that it is possible to manufacture a semiconductor optical device with a high yield by employing a simple process.

Thus, the above methods of the present invention are suitable for manufacturing a semiconductor optical device in which the waveguide ridge has an electrode on its top.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A method for manufacturing a semiconductor optical device comprising:
    forming a laminated semiconductor structure including a first semiconductor layer of a first conductivity type, an active layer, and a second semiconductor layer of a second conductivity type, in sequence, on a semiconductor substrate;
    forming, in a photolithography process, a first resist pattern of a first resist film on a top surface of the laminated semiconductor structure, the first resist pattern having a stripe-shaped portion having a width corresponding to a waveguide ridge;
    removing upper portions of the second semiconductor layer by dry etching, using the first resist pattern as a mask, forming concave portions sandwiching the waveguide ridge, and leaving a lower portion of the second semiconductor layer at the concave portions;
    removing the first resist pattern;
    forming a first insulating film on the top surface of the laminated semiconductor structure and in the concave portions;
    forming a second resist film covering the first insulating film in the concave portions and on the waveguide ridge;
    patterning the second resist film and forming a second resist pattern exposing the first insulating film on the waveguide ridge and respective portions of bottom surfaces of the concave portions, adjacent the waveguide ridge, the second resist pattern, in the concave portions, having a top surface at each of the concave portions farther from the substrate than a top surface of the second semiconductor layer in the waveguide ridge, and closer to the substrate than a top surface of the first insulating film on the waveguide ridge;
    heating the second resist film so that at least some of the second resist film in the concave portions flows and entirely covers the bottom surfaces of the concave portions;
    removing exposed portions of the first insulating film by etching, using the second resist pattern as a mask, and exposing the second semiconductor layer on the waveguide ridge; and
    forming an electrode layer on the second semiconductor layer on the waveguide ridge.

2. The method for manufacturing a semiconductor optical device according to claim 1, wherein the semiconductor substrate is GaN, the first semiconductor layer is AlGaN, the active layer is InGaN, and the second semiconductor layer is at least one semiconductor layer containing GaN.

3. The method for manufacturing a semiconductor optical device according to claim 1, including removing material of the second resist film uniformly by dry etching in an oxygen plasma.

4. The method for manufacturing a semiconductor optical device according to claim 3, including monitoring removal of the second resist film and exposure of the first insulating film by monitoring intensity of light generated in the dry etching by reaction of carbon with oxygen.

5. The method for manufacturing a semiconductor optical device according to claim 3 including monitoring removal of the second resist film and exposure of the top surface of the first insulating film by monitoring intensity of laser light reflected from the insulating film on the waveguide ridge.

6. The method for manufacturing a semiconductor optical device according to claim 1, including
    in removing upper portions of the second semiconductor layer by dry etching, using the first resist pattern as a mask, forming electrode pad portions extending from the concave portions, opposite the concave portions;
    in forming the second resist film, covering the electrode pad portions;
    in patterning the second resist film and forming the second resist pattern, exposing the first insulating film on the electrode pad portions;
    in removing material of the second resist film of the second resist pattern, from the second resist pattern, exposing the first insulating film on the electrode pad portions; and
    in removing the first insulating film by etching, using the second resist pattern as a mask, exposing the electrode pad portions.

7. A method for manufacturing a semiconductor optical device comprising:
    forming a laminated semiconductor structure including a first semiconductor layer of a first conductivity type, an active layer, and a second semiconductor layer of a second conductivity type, in sequence, on a substrate;
    forming, in a photolithography process, a first resist pattern of a resist film disposed on a top surface of the laminated semiconductor structure, the first resist pattern having a portion shaped corresponding to a waveguide ridge;
    removing upper portions of the second semiconductor layer by etching, using the first resist pattern as a mask, to form concave portions, leaving lower portions of the second semiconductor layer, and forming the waveguide ridge;
    removing the first resist pattern;
    forming a first insulating film on the top surface of the laminated semiconductor structure, and in the concave portions;
    forming a second resist film covering the first insulating film in the concave portions, on the waveguide ridge;
    patterning the second resist film and forming a second resist pattern covering the first insulating film on the waveguide ridge and respective portions of bottom surfaces of the concave portions, adjacent the waveguide ridge, and exposing a top surface of the first insulating film, on top of the waveguide ridge, the second resist pattern, in the concave portions, having a top surface at each of the concave portions farther from the substrate than a top surface of the second semiconductor layer in the waveguide ridge and closer to the substrate than a top surface of the first insulating film on the waveguide ridge;

heating the second resist film so that at least some of the second resist film in the concave portions flows and entirely covers the bottom surfaces of the concave portions;

removing the first insulating film by etching, using the second resist pattern as a mask, and exposing a top surface of the second semiconductor layer on the waveguide ridge; and forming an electrode layer on the top surface of the second semiconductor layer on the waveguide ridge.

8. The method for manufacturing a semiconductor optical device according to claim 7, including removing material of the second resist film uniformly by dry etching in an oxygen plasma.

9. The method for manufacturing a semiconductor optical device according to claim 8, including monitoring removal of the second resist film and exposure of the first insulating film by monitoring intensity of light generated in the dry etching by reaction of carbon with oxygen.

10. The method for manufacturing a semiconductor optical device according to claim 8, including monitoring removal of the second resist film and exposure of the first insulating film by monitoring intensity of laser light reflected from the insulating film on the waveguide ridge.

11. The method for manufacturing a semiconductor optical device according to claim 7, including in removing upper portions of the second semiconductor layer by dry etching, using the first resist pattern as a mask, forming electrode pad portions extending from the concave portions, opposite the concave portions;

in forming the second resist film, covering the electrode pad portions;

in patterning the second resist film and forming the second resist pattern, exposing the first insulating film on the electrode pad portions;

in removing material of the second resist film of the second resist pattern, from the second resist pattern, exposing the first insulating film on the electrode pad portions; and in removing the first insulating film by etching, using the second resist pattern as a mask, exposing the electrode pad portions.

* * * * *